(12) United States Patent
Gu et al.

(10) Patent No.: US 10,811,793 B2
(45) Date of Patent: *Oct. 20, 2020

(54) MOBILE TERMINAL, POWER ADAPTER AND POWER INTERFACE

(71) Applicant: GUANGDONG OPPO MOBILE TELECOMMUNICATIONS CORP., LTD., Dongguan, Guangdong (CN)

(72) Inventors: Guodong Gu, Guangdong (CN); Feifei Li, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,080

(22) Filed: Jun. 14, 2019

(65) Prior Publication Data

US 2019/0296463 A1 Sep. 26, 2019

Related U.S. Application Data (63) Continuation of application No. 16/245,054, filed on Jan. 10, 2019, and a continuation-in-part of
(Continued)

(30) Foreign Application Priority Data

Jul. 27, 2016 (CN) .......................... 2016 1 0605836
Jul. 27, 2016 (CN) .......................... 2016 2 0803045

(51) Int. Cl.
*H01R 12/58* (2011.01)
*H01R 13/504* (2006.01)
(Continued)

(52) U.S. Cl.
CPC .............. *H01R 12/58* (2013.01); *B67D 7/32* (2013.01); *H01R 12/716* (2013.01);
(Continued)

(58) Field of Classification Search
CPC .... H01R 12/58; H01R 12/716; H01R 13/504; H01R 13/506
See application file for complete search history.

(56) References Cited

U.S. PATENT DOCUMENTS 9,093,797 B2 * 7/2015 Zhao .................... H01R 12/707
9,350,128 B1   5/2016 Chen et al.
(Continued)

FOREIGN PATENT DOCUMENTS

CN    201112871 Y    9/2008
CN    204271346 U    9/2008
(Continued)

OTHER PUBLICATIONS

A first Chinese Office Action dated Jun. 1, 2017 for Application No. CN 20161065836.3.
(Continued)

*Primary Examiner* — Xuong M Chung Trans
(74) *Attorney, Agent, or Firm* — Ladas & Parry LLP (57) ABSTRACT

A power interface may include a housing, a connection body, and a second stopping plate. A first stopping plate may be arranged in the housing. The connection body may be arranged in the housing. An engaging flange may be arranged on the connection body. A second stopping plate may be attached on an inner face of the housing along a circumference direction of the housing. The second stopping plate may be spaced apart from the first stopping plate. The engaging flange may be sandwiched between the first stop-
(Continued)

ping plate and the second stopping plate. A mobile terminal and a method for manufacturing a power interface are also provided.

20 Claims, 7 Drawing Sheets

Related U.S. Application Data application No. PCT/CN2017/082260, filed on Apr. 27, 2017.

(51) Int. Cl.
| | |
|---|---|
| *H01R 13/506* | (2006.01) |
| *B67D 7/32* | (2010.01) |
| *H01R 12/71* | (2011.01) |
| *H01R 13/28* | (2006.01) |
| *H01R 24/60* | (2011.01) |
| *H01R 107/00* | (2006.01) |

(52) U.S. Cl.
CPC ......... *H01R 13/504* (2013.01); *H01R 13/506* (2013.01); *H01R 13/28* (2013.01); *H01R 24/60* (2013.01); *H01R 2107/00* (2013.01); *H05K 2201/10431* (2013.01)

(56) References Cited

U.S. PATENT DOCUMENTS

| | | | |
|---|---|---|---|
| 9,728,916 | B1* | 8/2017 | Tsai ................. H01R 24/60 |
| 9,742,098 | B2* | 8/2017 | Zhao ................. H01R 13/5202 |
| 2014/0087576 | A1 | 3/2014 | Kuo |
| 2015/0325951 | A1 | 11/2015 | Chen et al. |
| 2016/0294108 | A1 | 10/2016 | Tsai et al. |
| 2016/0372876 | A1 | 12/2016 | Zhang et al. |
| 2017/0201048 | A1* | 7/2017 | Kong ................ H01R 13/6594 |
| 2017/0271823 | A1* | 9/2017 | Zhao ................ H01R 13/405 |
| 2017/0373439 | A1* | 12/2017 | Wen ................ H01R 13/04 |

FOREIGN PATENT DOCUMENTS

| | | |
|---|---|---|
| CN | 202363674 U | 6/2012 |
| CN | 102683984 A | 9/2012 |
| CN | 203277778 U | 11/2013 |
| CN | 102683984 B | 5/2014 |
| CN | 204361354 U | 5/2015 |
| CN | 104752888 A | 7/2015 |
| CN | 104810640 A | 7/2015 |
| CN | 104862705 A | 9/2015 |
| CN | 105356097 A | 2/2016 |
| CN | 105449398 A | 3/2016 |
| CN | 205159595 U | 4/2016 |
| CN | 105655787 A | 6/2016 |
| CN | 205282692 U | 6/2016 |
| CN | 205355364 U | 6/2016 |
| CN | 106025672 A | 10/2016 |
| CN | 205882211 U | 1/2017 |
| CN | 206882229 U | 1/2017 |
| CN | 205960247 U | 2/2017 |
| GB | 2468495 A | 9/2010 |
| JP | 3204252 U | 5/2016 |
| WO | WO2015113340 A1 | 8/2015 |

OTHER PUBLICATIONS

An International Search Report (ISR) and Written Opinion (WO) dated Aug. 8, 2017 for Application No. PCT/CN2017/082260.
A second Chinese Office Action dated Sep. 6, 2017 for Application No. CN 201610605836.3.
A third Chinese Office Action dated Dec. 19, 2017 for Application No. CN 201610605836.3.
A Notification to Grant Patent Right for Invention dated Mar. 16, 2018 for Application No. CN 201610605836.3; and.
A Notification to Grant Patent Right for Invention dated Apr. 3, 2019 for Application No. CN 20180282259.8, and references cited therein.
First Office Action from China patent office in counterpart Chinese patent Application 201610805836.3, dated Jun. 1, 2017 (6 pages).
The National Intellectual Property Administration of People's Republic of China, Notification to Grant Patent Right for CN Application 201610605838.3, dated Mar. 16, 2018 (1 pages).
International search report for Application No. PCT/CN2017/082260, dated Aug. 8, 2017 (9 pages).
Second Office Action from China patent office in counterpart Chinese patent Application 201610605836.3, dated Sep. 6, 2017 (6 pages).
Third Office Action from China patent office in counterpart Chinese patent Application 201610605836.3, dated Dec. 19, 2017 (6 pages).
The National Intellectual Property Administration of People's Republic of China, Notification to Grant Patent Right for CN Application 201810282259.8, dated Apr. 3, 2019 (2 pages).
European search report for Application No. EP17833278.96, dated May 31, 2019 (8 pages).
Indian examination report for Application No. 201917005032, dated Mar. 12, 2020 (6 pages).

* cited by examiner

FIG. 12

MOBILE TERMINAL, POWER ADAPTER AND POWER INTERFACE

CROSS-REFERENCE TO RELATED APPLICATIONS

The present application is a continuation-application of U.S. patent application Ser. No. 16/245,054 filed on Jan. 10, 2019, which is a continuation in part application of International (PCT) Patent Application No. PCT/CN2017/082260 filed Apr. 27, 2017, which claims foreign priority of Chinese Patent Application No. 201610605836.3, filed on Jul. 27, 2016 and Chinese Patent Application No. 201620803045.7, field on Jul. 27, 2016, the entire contents of which are hereby incorporated by reference in their entireties.

TECHNICAL FIELD

The described embodiments relate to communication technology, and in particular to a mobile terminal, a power interface, and a method for manufacturing the power interface.

BACKGROUND

With the continuous improvement of living conditions, mobile phones have become essential communication tools for people. In order to meet the requirements of users, and improve the market competitiveness of the mobile phones, on one hand, researchers and developers continue to improve the performance of mobile phones; on the other hand, researchers and developers continue to improve and optimize the appearance of mobile phones. Charging sockets are important components for the mobile phones. On one hand, when charging the mobile phones, the mobile phones need to be charged via the charging sockets; on the other hand, it is possible to achieve data transmission between the mobile phones and other devices by means of the charging sockets.

SUMMARY OF THE DISCLOSURE

According to an aspect of the present disclosure, a power interface may be provided. The power interface may include a housing, a connection body arranged in the housing, and a plurality of second stopping plates. A first stopping plate may be arranged in the housing. An engaging flange may be arranged on the connection body. The connection body may be configured to be connected to a circuit board and include at least a pair of power pins. Each pair of power pins may include two sub-pins spaced apart from each other in an up-down direction. An intermediate patch may be sandwiched between the two sub-pins. At least one sub-pin may include an expanded portion. A recess may be defined in the expanded portion at a position that is close to the front end of the sub-pin. The plurality of second stopping plates may be located in the housing and connected to the housing and shaping an annular configuration. The plurality of second stopping plates may be spaced apart from the first stopping plate. The engaging flange may be sandwiched between the first stopping plate and the plurality of second stopping plates. A stopping protrusion may be arranged on a sidewall face of the first stopping plate facing towards the plurality of second stopping plates. The stopping protrusion may be engaged with the engaging flange.

According to another aspect of the present disclosure, a mobile terminal may be provided. The mobile terminal may include a power interface. The power interface may include a housing, a connection body arranged in the housing, and a plurality of second stopping plates. A first stopping plate may be arranged in the housing. An engaging flange may be arranged on the connection body. The connection body may be configured to be connected to a circuit board and include at least a pair of power pins. Each pair of power pins may include two sub-pins spaced apart from each other in an up-down direction. An intermediate patch may be sandwiched between the two sub-pins. At least one sub-pin may include an expanded portion. A recess may be defined in the expanded portion at a position that is close to the front end of the sub-pin. The plurality of second stopping plates may be located in the housing and connected to the housing and shaping an annular configuration. The plurality of second stopping plates may be spaced apart from the first stopping plate. The engaging flange may be sandwiched between the first stopping plate and the plurality of second stopping plates. A stopping protrusion may be arranged on a sidewall face of the first stopping plate facing towards the plurality of second stopping plates. The stopping protrusion may be engaged with the engaging flange.

According to another aspect of the present disclosure, a power adapter may be provided. The power adapter may include a power interface. The power interface may include a housing, a connection body arranged in the housing, and a plurality of second stopping plates. A first stopping plate may be arranged in the housing. An engaging flange may be arranged on the connection body. The connection body may be configured to be connected to a circuit board and include at least a pair of power pins. Each pair of power pins may include two sub-pins spaced apart from each other in an up-down direction. An intermediate patch may be sandwiched between the two sub-pins. At least one sub-pin may include an expanded portion. A recess may be defined in the expanded portion at a position that is close to the front end of the sub-pin. The plurality of second stopping plates may be located in the housing and connected to the housing and shaping an annular configuration. The plurality of second stopping plates may be spaced apart from the first stopping plate. The engaging flange may be sandwiched between the first stopping plate and the plurality of second stopping plates. A stopping protrusion may be arranged on a sidewall face of the first stopping plate facing towards the plurality of second stopping plates. The stopping protrusion may be engaged with the engaging flange.

DETAILED DESCRIPTION

Embodiments of the present disclosure will be described in detail below, and examples of the embodiments will be illustrated in the accompanying drawings. The embodiments described below with reference to the drawings are illustrative and are intended to explain the present disclosure, and cannot be construed as a limitation to the present disclosure.

In the description of the present disclosure, it is to be understood that terms such as "up", "down", "front", "rear", "left", "right", "top", "bottom", "inner", "outer", "circumferential", and the like, refer to the orientations and locational relations illustrated in the accompanying drawings. Thus, these terms used here are only for describing the present disclosure and for describing in a simple manner, and are not intended to indicate or imply that the device or the elements are disposed to locate at the specific directions or are structured and performed in the specific directions, which could not to be understood as limiting the present disclosure.

In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the description of the present disclosure, "a plurality of" means two or more, such as two, three, and the like, unless specified otherwise.

In the present disclosure, unless specified or limited, otherwise, terms "mounted", "connected", "coupled", "arranged", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by one skilled in the art depending on specific contexts.

Hereafter, the term "up-down direction" used in the present disclosure may refer to a width direction of the power interface 100. The term "left-right direction" used in the present disclosure may refer to a length direction of the power interface 100. The term "front-rear direction" used in the present disclosure may refer to a height direction of the power interface 100. It will be appreciate that the directions defined here are only for explanation, not for limitation.

The power interface according to an embodiment of the present disclosure may include a housing, a connection body arranged in the housing, and a second stopping plate located in the housing. The first stopping plate can be arranged in the housing. An engaging flange can be arranged on the connection body. The second stopping plate can be connected to the housing and spaced apart from the first stopping plate. The engaging flange can be sandwiched between the first stopping plate and the second stopping plate.

In another embodiment, the housing and the second stopping plate can be made of metal. The second stopping plate can be welded to the housing.

In another embodiment, the second stopping plate can be made of stainless steel.

In another embodiment, a gap may be defined between the second stopping plate and the housing. An adhesive layer may be arranged in the gap.

In further another embodiment, the adhesive layer may be a dispensing layer.

In still another embodiment, the second stopping plate can extend along a circumferential direction of the connection body.

In still further another embodiment, the power interface comprises a plurality of second stopping plates. The plurality of second stopping plates are arranged around the connection body. Each second stopping plate is spaced apart from each other along the circumference direction of the housing.

In another embodiment, the first stopping plate may extend along a circumferential direction of the connection body.

In further another embodiment, the power interface may be a USB Type-C interface.

The mobile terminal according to an embodiment of the present disclosure may include the power interface as described above.

In an embodiment, the mobile terminal may be a mobile phone, a tablet computer or a laptop.

The power adapter according to an embodiment of the present disclosure may include the power interface as described above.

The power interface according to an embodiment of the present disclosure may include a housing, a connection body arranged in the housing, and a second stopping plate. A first stopping plate can be arranged in the housing. An engaging flange can be arranged on the connection body. The second stopping plate can be attached on an inner face of the housing along a circumference direction of the housing and spaced apart from the first stopping plate. The engaging flange may be sandwiched between the first stopping plate and the second stopping plate.

In another embodiment, the second stopping plate may extend along a peripheral circumferential direction of the connection body to shape an annular configuration.

In another embodiment, a stopping protrusion can be arranged on a sidewall face of the first stopping plate facing towards the second stopping plate. An engaging groove may be defined in the engaging flange. The stopping protrusion may be engaged in the engaging groove.

In another embodiment, the connection body may be configured to be connected to a circuit board and comprises at least one power-pin assembly. And each power-pin assembly may include a pair of power pins spaced apart from each other.

In further another embodiment, at least one of the pair of power pins may include an expanded portion. The expanded portion may have a cross-sectional area larger than that of a data pin of the connection body to increase a current load of the at least one of the pair of power pins.

In still another embodiment, a recess may be defined in the expanded portion at a position that may be close to a front end of the at least one of the pair of power pins.

In still further another embodiment, the expanded portion may be located in a middle of the at least one of the pair of power pins.

The method for manufacturing a power interface according to an embodiment of present disclosure may include: processing a housing, wherein a first stopping plate may be arranged in the housing; mounting a connection body into the housing, wherein an engaging flange may be arranged on the connection body; and welding a second stopping plate on an inner face of the housing, wherein the second stopping plate may be attached on the inner face of the housing along a circumference direction of the housing and spaced apart from the first stopping plate, such that the engaging flange may be sandwiched between the first stopping plate and the second stopping plate.

In another embodiment, the housing may be an injection molded part. The first stopping plate may be injected on the inner face of the housing.

In another embodiment, the second stopping plate may be connected to the housing by means of spot welding.

In further another embodiment, a gap may be defined between the second stopping plate and the inner face of the housing. The method may further include arranging an adhesive layer in the gap.

The mobile terminal according to an embodiment of the present disclosure may include a circuit board and a power interface. The power interface may be configured to be connected to a power adapter and may include a housing connected to the circuit board, a stopping plate arranged in the housing, an annular baffle arranged in the housing, a connection body arranged in the housing, and a plurality of positioning protrusions. The stopping plate may be connected to the housing and may define a first through hole. The annular baffle may be connected to the housing and may define a second through hole. The annular baffle may be spaced apart from the stopping plate. The connection body may pass through the first through hole and the second through hole and may be connected to the circuit board. The plurality of positioning protrusions may be arranged on a peripheral face of the connection body and sandwiched between the stopping plate and the annular baffle.

In another embodiment, the plurality of stopping protrusions can be arranged on a sidewall face of the stopping plate facing towards the annular baffle. Two adjacent positioning protrusions can define an engaging groove. Each of the stopping protrusions can be engaged in a corresponding engaging groove.

In further another embodiment, the connection body can include at least one power-pin assembly. And each power-pin assembly may include a pair of power pins spaced apart from each other.

In still another embodiment, at least one of the pair of power pins may include an expanded portion. The expanded portion may have a cross-sectional area larger than that of a data pin of the connection body to increase a current load of the at least one of the pair of power pins.

In another embodiment, the power interface may include an intermediate patch sandwiched between the pair of power pins.

In the following, a power interface 100 may be will be described in embodiments of the present disclosure with reference to FIGS. 1-11. It should be understood that, the power interface 100 may include an interface configured for charging or data transmission, and may be arranged in a mobile terminal such as a mobile phone, a tablet computer, a laptop, or any other suitable mobile terminal having a rechargeable function. The power interface 100 may be electrically connected to a corresponding power adapter to achieve a communication of electrical signals and data signals.

FIGS. 1-11 illustrate the power interface 100. The power interface 100 according to an embodiment of the present disclosure may include a housing 1, a connection body 2, and an intermediate patch 23.

Specifically, a first stopping plate 11 may be arranged in the housing 1. The connection body 2 may be arranged in the housing 1. An engaging flange 2422 may be arranged on the connection body 2. A second stopping plate 3 may be attached on an inner face 1111 of the housing 1 along a circumference direction of the housing 1. The second stopping plate 3 may be spaced apart from the first stopping plate 11. The engaging flange 2422 may be sandwiched between the first stopping plate 11 and the second stopping plate 3. In this way, the engaging flange 2422 may be fixed in the housing 1 by the first stopping plate 11 and the second stopping plate 3, and the connection body 2 may be fixed in the housing 1. Thus, the connection body 2 may be prevented from moving in an up-down direction of the housing 1 to prevent the connection body 2 from being separated from the housing 1. Therefore, when a connection line of a power adapter is inserted into the power interface 100, the reliability of the connection between the connection line and the power interface 100 may be improved.

It should be noted that, the power interface 100 may be arranged on a mobile terminal, and a battery can be arranged inside the mobile terminal (e.g., a mobile phone, a tablet computer, a notebook computer, etc.). The battery may be charged by an external power source via the power interface 100.

In the power interface 100 of the embodiment of the present disclosure, by arranging the first stopping plate 11 in the housing 1 and arranging the engaging flange 2422 on the connection body 2, and fixing the engaging flange 2422 in the housing 1 by the first stopping plate 11 and the second stopping plate 3, the connection body 2 can be fixed in the housing 1 to prevent the connection body 2 from moving in the up-down direction of the housing 1, and the connection body 2 can be prevented from being separated from the housing 1. Therefore, when a connection line of a power adapter is inserted into the power interface 100, the reliability of the connection between the connection line and the power interface 100 may be improved.

In some embodiments of the present disclosure, the housing 1 and the second stopping plate 3 may be made of metal, and the second stopping plate 3 may be welded on the housing 1. The housing 1 and the second stopping plate 3 made of metal may have a great structural strength. In this way, it is possible to enhance the structural strength of the power interface 100, and the power interface 100 may be prevented from being deformed after a long time of use or after frequent insertion and removal. In addition, since the inner space of the housing 1 is limited, when the second stopping plate 3 is welded on the housing 1, it is possible to simplify the processing and assembling processes, shorten manufacturing cycles, and reduce the manufacturing cost.

In one embodiment, the second stopping plate 3 may be made of stainless steel. In this way, it is possible to avoid the second stopping plate 3 from rusting, and thus the poor contact of the connection body 2 with a power adapter due to the rusting of the second stopping plate 3 may be prevented from occurring. Therefore, the reliability of the operation of the power interface 100 may be ensured.

Figure 8:
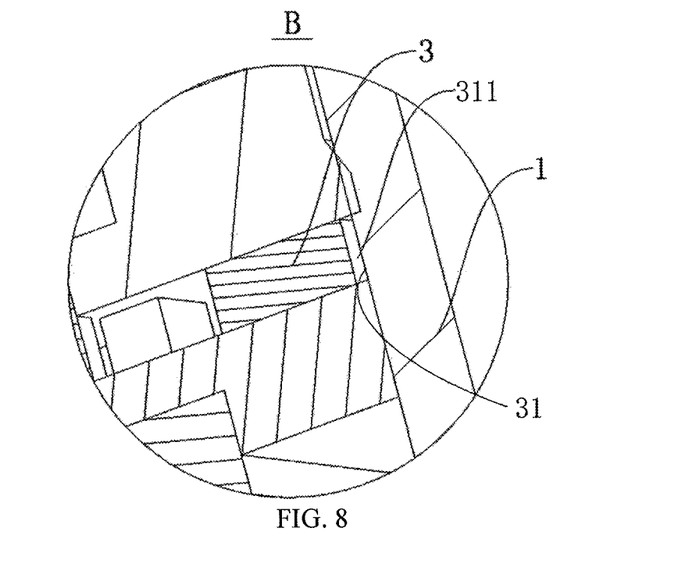
FIG. 8 is a partially enlarged view of portion B of FIG. 7.

In some embodiments of the present disclosure, as shown in FIG. 8, a gap 31 may be defined between the second stopping plate 3 and the housing 1, and an adhesive layer 311 may be arranged in the gap 31. On one hand, the adhesive layer 311 may further bond the second stopping plate 3 with the housing 1, to improve the reliability of the connection between the second stopping plate 3 and the housing 1. On the other hand, the adhesive layer 311 may have a waterproof function; that is, the adhesive layer 311 may prevent liquid from entering the power interface 100 via an open end of the power interface 100 and damaging of the circuit board 25 inside the power interface 100, and the like, thereby ensuring the reliability of the power interface 100.

More specifically, the adhesive layer 311 may be a dispensing layer. Dispensing is a process in which electronic glue, oil or other liquid may be applied to a product by means of painting, potting, or dripping, to allow the product to be adhesive, potted, insulated, fixed, and have a smooth face. On one hand, the dispensing layer may further bond the second stopping plate 3 with the housing 1 to improve the reliability of the connection between the second stopping plate 3 and the housing 1. On the other hand, the dispensing layer may have a waterproof function; that is, the dispensing layer may prevent liquid from entering the power interface 100 via an open end of the power interface 100 and damaging of the circuit board 25 inside the power interface 100, and the like, thereby ensuring the reliability of the power interface 100.

In some embodiments of the present disclosure, as shown in FIGS. 4-7, the second stopping plate 3 may extend in a peripheral circumferential direction of the connection body 2. On one hand, it is possible to improve the reliability of the connection between the second stopping plate 3 and the housing 1; on the other hand, it is also possible to enhance the fixing of the connection body 2 by the second stopping plate 3. In this way it is possible to ensure that the connection body 2 is securely fixed in the housing 1, and improve the reliability of the connection between a power line of a power adapter and the power interface 100.

Alternatively, a plurality of second stopping plates 3 may be provided, thereby facilitating the processing of the second stopping plate 3. It should be noted that, the plurality of second stopping plates 3 may be spaced apart from each other along the circumferential direction of the housing 1, and the plurality of second stopping plates 3 may also form an annular stopping plate. The plurality of second stopping plates 3 may be respectively connected to the housing 1, in order to fix the connection body 2.

In some embodiments of the present disclosure, as shown in FIGS. 4-7, the first stopping plate 11 may also extend in the circumferential direction of the connection body 2. In this way, it is possible to enhance the fixing of the connection body 2 by the first stopping plate 11. Alternatively, a stopping protrusion 111 may be arranged on a sidewall face of the first stopping plate 11 that faces towards the second stopping plate 3. An engaging groove 2423 may be defined in the engaging flange 2422. The stopping protrusion 111 may be engaged in the engaging groove 2423. In this way, the first stopping plate 11 and the second stopping plate 3 may prevent the connection body 2 from moving in the up-down direction in the housing 1, and may also prevent the connection body 2 from shaking in the housing 1 by the cooperation between the engaging flange 2422 and the stopping protrusion 111, and thus it is possible to ensure the reliability of the operation of the power interface 100.

Figure 1:
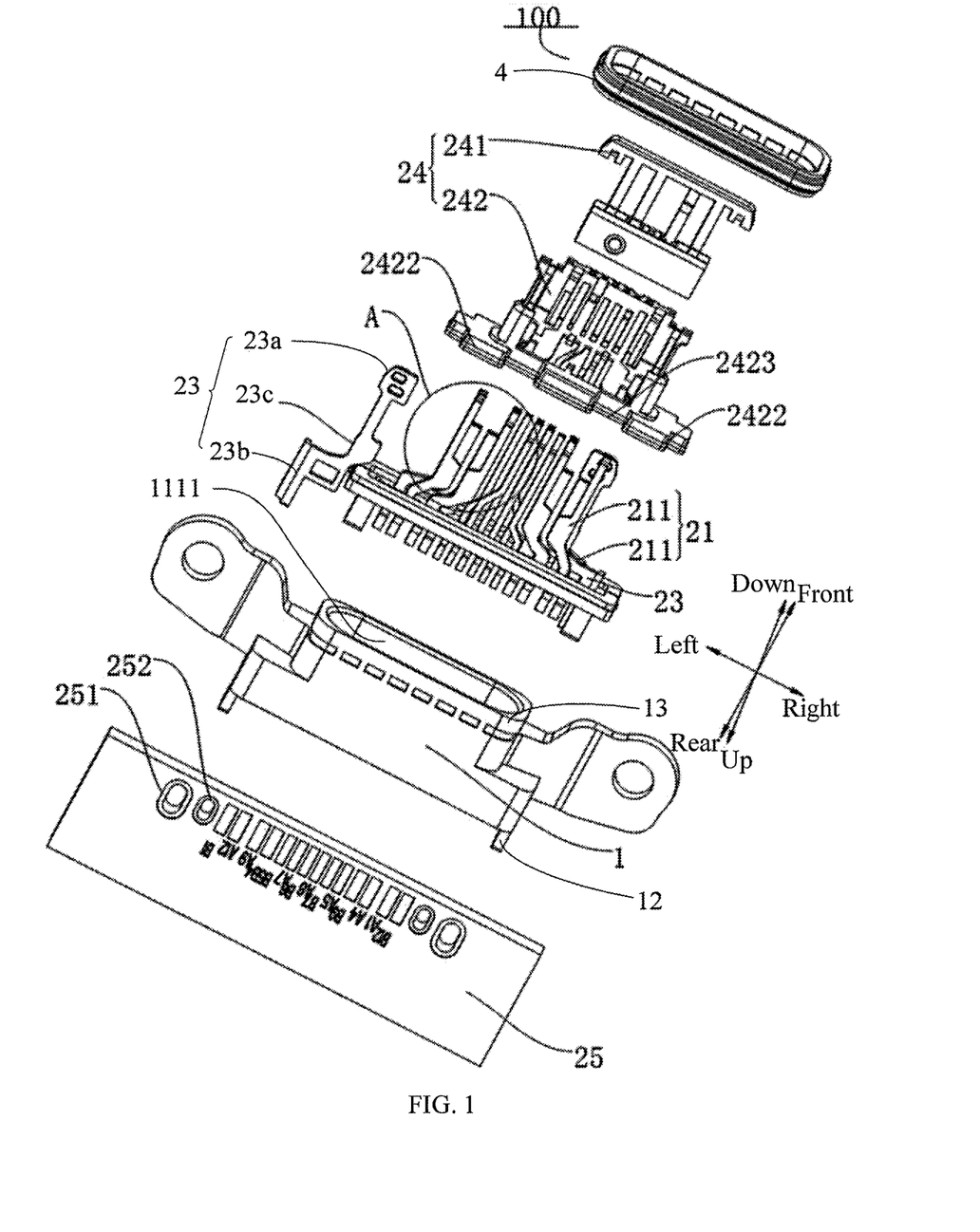
FIG. 1 is an explosive view of a power interface according to an embodiment of the present disclosure.

Referring to FIG. 1, the connection body 2 may be configured to be connected to a circuit board 25, and may include at least one power-pin assembly 21. In this embodiment, each power-pin assembly 21 may include a pair of power pins 211 spaced apart from each other in an up-down direction (the up-down direction as shown in FIG. 1). The intermediate patch 23 may be sandwiched between the two power pins 211, and configured to support the power pins 211. Therefore, it is possible to avoid poor contact between a connecting line and the power interface 100 caused by the movement of the pair of power pins 211 which are spaced apart from each other in the up-down direction towards each other when the connection line is inserted into the power interface. In this way, it is possible to ensure the reliability of the connection between the connection line and the power interface 100.

The intermediate patch 23 may have a head end 23a close to a front end of the power-pin assembly 21 (the front end as shown in FIG. 1), a tail end 23b close to a rear end of the power-pin assembly 21 (the rear end as shown in FIG. 1), and a connection portion 23c connected between the head end 23a and the tail end 23b. More specifically, the tail end 23b may be the one connected to the circuit board 25, and the head end 23a may be the one away from the circuit board 25 and opposite to the tail end 2.

The tail end 23b may be spaced apart from the housing 1 and connected to the connection body 2. When designing the tail end 23b being spaced apart from the housing 1, it is possible to avoid producing interference with antenna signals, and thus the quality and the speed of signal transmission may be improved. In addition, both the tail end 23b and the housing 1 may be connected to the connection body 2. In this way, the intermediate patch 23, the housing 1, and the connection body 2 may be connected to each other, thereby improving the reliability of the connection among the intermediate patch 23, the housing 1, and the connection body 2.

Figure 5:
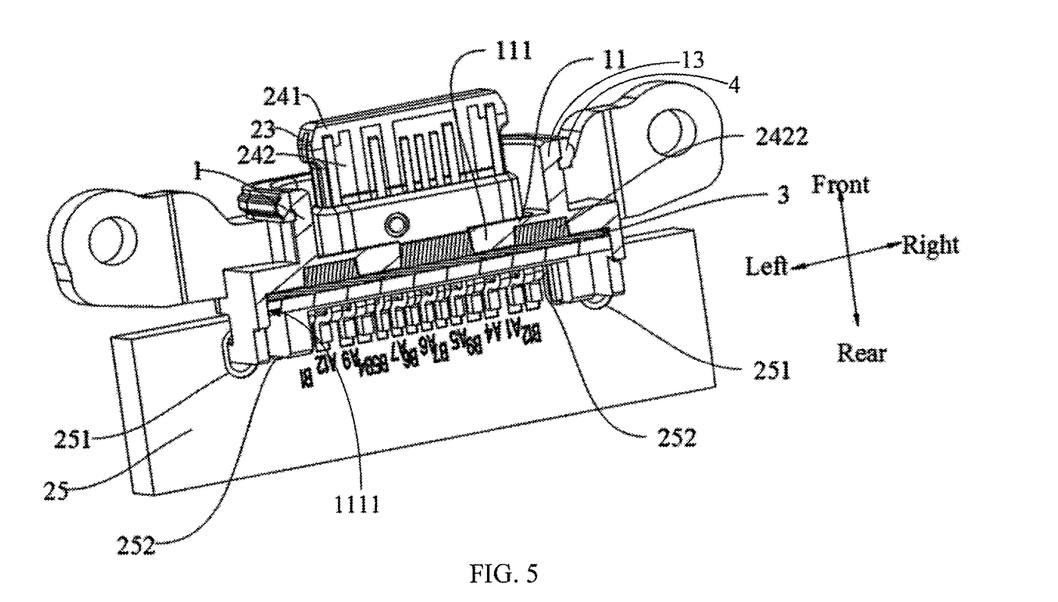
FIG. 5 is a cutaway view of the power interface viewing in another angle according to some embodiments of the present disclosure.

In some embodiments of the present disclosure, as shown in FIG. 1 and FIG. 5, a plurality of first pads 251 and a plurality of second pads 252 may be arranged on the circuit board 25. Each of the plurality of first pads 251 and each of the plurality of second pads 252 may be spaced apart from each other. The housing 1 may be welded on the first pad 251, and the tail end 23b may be welded on the second pad 252. In this way, the housing 1 and the intermediate patch 23 may be connected to the circuit board 25, thereby firmly fixing the connection body 2 to the circuit board 25 and preventing the power-pin assembly 21 of the connection body 2 from falling off the circuit board 25, and thus the reliability of the operation of the power interface 100 may be ensured.

More specifically, the housing 1 may include a connecting end 12 configured to be connected to the circuit board 25. The connecting end 12 may be substantially parallel to the tail end 23b of the intermediate patch 23, and spaced apart from the tail end 23b. The connecting end 12 may be welded on the first pad 251.

Figure 2:
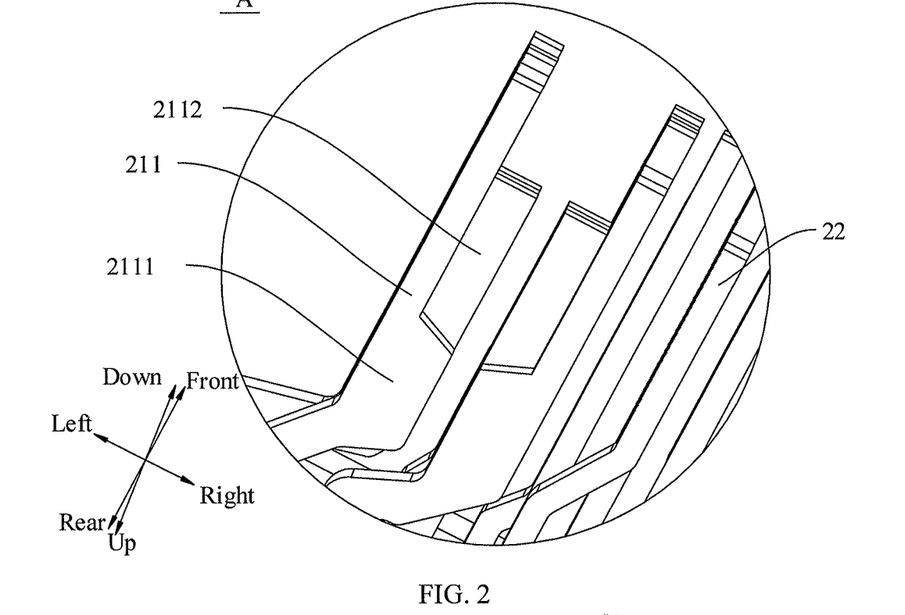
FIG. 2 is a partially enlarged view of portion A of FIG. 1.

In some embodiments of the present disclosure, as shown in FIG. 2, at least one power pin 211 may include an expanded portion 2111. The expanded portion 2111 may have a cross-sectional area larger than that of a data pin 22 of the connection body 2. In this way, the current load of the power pins 211 may be increased, and the transmission speed of the current may be improved. In this way, the power interface 100 may have a fast charging function, thereby improving the charging efficiency of the battery.

Figure 11:
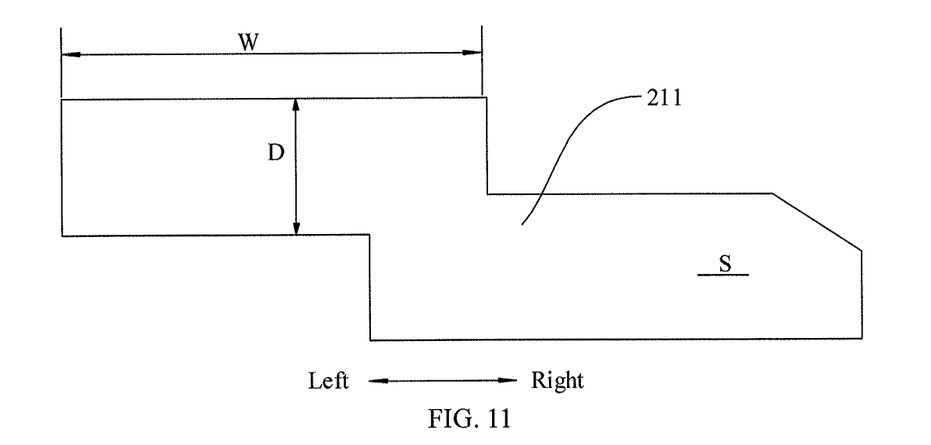
FIG. 11 is a structural view of a power pin of the power interface according to some embodiments of the present disclosure.

Optionally, as shown in FIG. 11, the cross-sectional area of the expanded portion 2111 may be defined as S, and $S \geq 0.09805$ mm$^2$. It has been experimentally verified that when $S \geq 0.09805$ mm$^2$, the current load of the power pins 211 may be at least 10 A. Therefore, the charging efficiency can be improved by increasing the current load of the power pins 211. After further tests, when S=0.13125 mm², the current load of the power pins 211 may be 12 A or more, which can improve charging efficiency.

Furthermore, as shown in FIG. 11, a thickness of the power pin 211 may be defined as D, and 0.1 mm≤D≤0.3 mm. It has been experimentally verified that when 0.1 mm≤D≤0.3 mm, the current load of the power pins 211 is at least 10 A. In this way, it is possible to improve the charging efficiency by increasing the current load of the power pins 211. After further tests, when D=0.25 mm, the current load of the power pins 211 may be greatly increased, and the current load of the power pins 211 is 12 A or more, thereby improving the charging efficiency.

Figure 9:
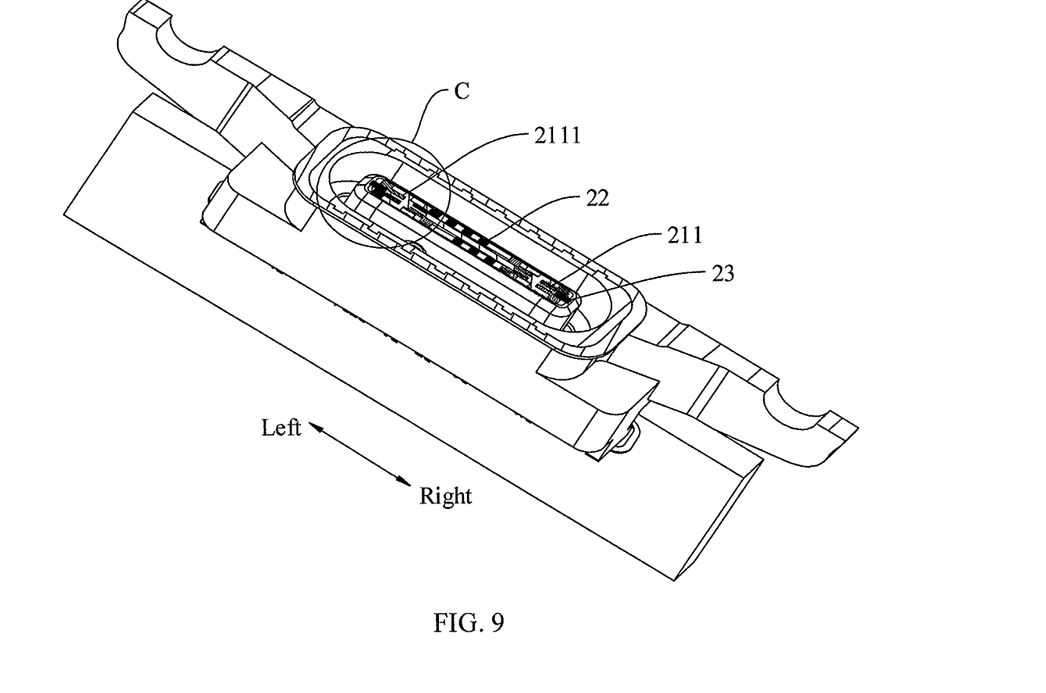
FIG. 9 is a cutaway view of the power interface viewing in still a further angle according to some embodiments of the present disclosure.
Figure 10:
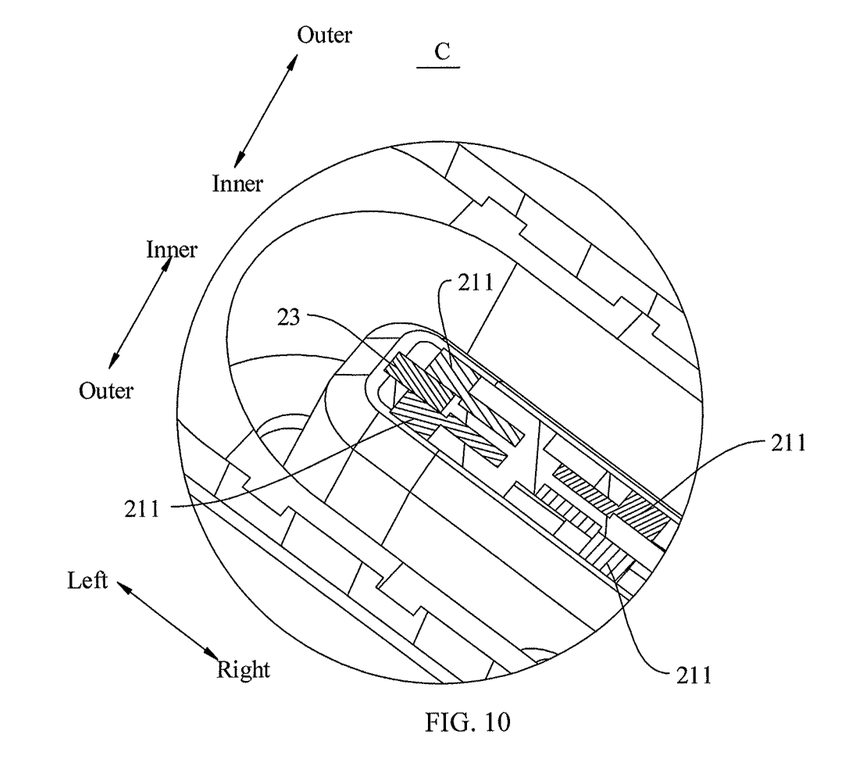
FIG. 10 is a partially enlarged view of portion C of FIG. 9.

Referring to FIGS. 9-11, each power pin 211 may have a contact surface configured to be electrically connected to a power adapter. In a width direction of the power pin 211 (i.e. the left-right direction shown in FIG. 6), a width of the contact surface may be defined as W, which meets 0.24 mm≤W≤0.32 mm. It has been experimentally verified that when 0.24 mm≤W≤0.32 mm, the current load of the power pin 211 is at least 10 A. In this way, it is possible to improve the charging efficiency by increasing the current load of the power pins 211. After further tests, when W=0.25 mm, the current load of the power pin 211 may be greatly increased, and the current load of the power pins 211 is 12 A or more, thereby improving the charging efficiency.

According to some embodiments of the present disclosure, referring to FIG. 2, the expanded portion 2111 may be located in the middle of the power pin 211. In this way, the arrangement of the power pins 211 and the data pins 22 may be optimized, and the space of the power interface 100 may be fully utilized. Therefore, the compactness and the rationality of the configuration of the power interface 100 may be improved.

Furthermore, as shown in FIG. 2, a recess 2112 may be defined in the expanded portion 2111 at a position that is close to the front end of the power pin 211. It should be noted that, when the power interface 100 performs the fast charging function, the power pin 211 with the expanded portion 2111 may be used to carry a large charging current. When the power interface 100 performs the normal charging function, the recess 2112 defined in the expanded portion 2111 may prevent the power pin 211 from getting into contact with a corresponding pin of a power adapter. In this way, the power interface 100 in this embodiment may be applied to different power adapters. For example, when the power interface 100 performs the fast charging function, the power interface 100 may be electrically connected to a corresponding power adapter with the fast charging function. When the power interface 100 performs the normal charging function, the power interface 100 may be electrically connected to a corresponding normal power adapter. It should be noted that, the fast charging function herein may refer to a charging state in which the charging current is greater than or equal to 2.5 A, and the normal charging may refer to a charging state in which the charging current is less than 2.5 A.

Figure 6:
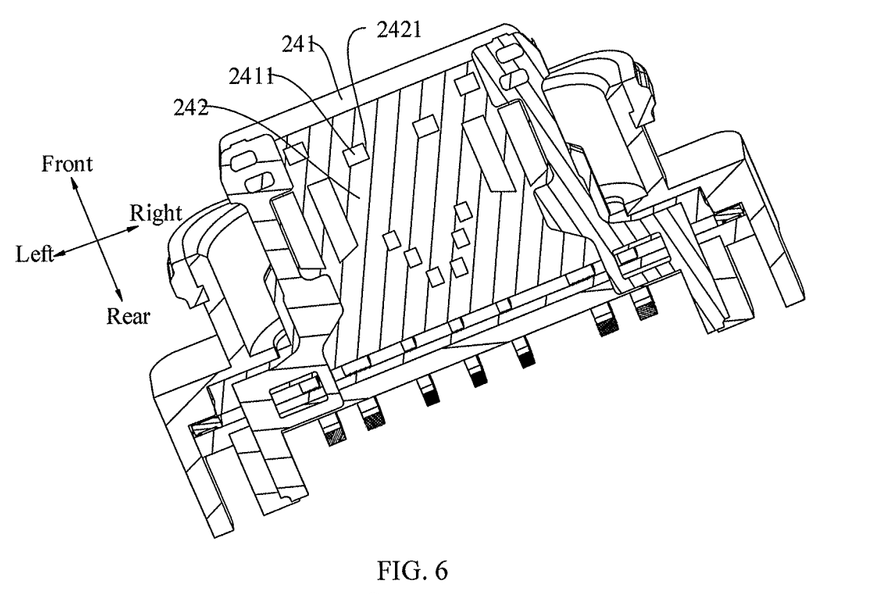
FIG. 6 is a cutaway view of the power interface viewing in yet another angle according to some embodiments of the present disclosure.
Figure 7:
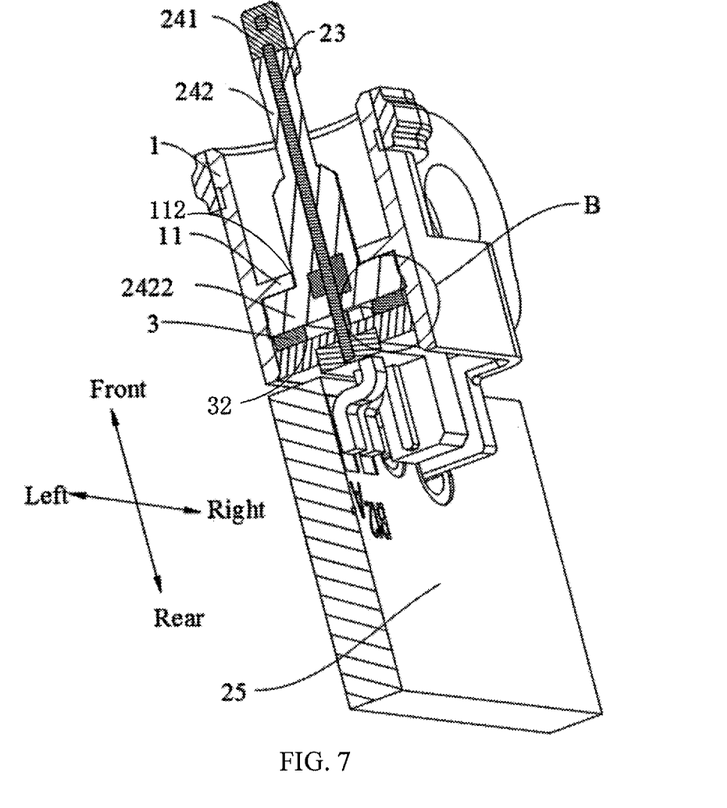
FIG. 7 is a cutaway view of the power interface viewing in a further angle according to some embodiments of the present disclosure.

In some embodiments of the present disclosure, as shown in FIGS. 1 and 5 and 6, the power interface 100 may further include an encapsulation member 24, and the intermediate patch 23 and the connection body 2 may be wrapped by the encapsulation member 24. The encapsulation member 24 may be made of electrical insulating and heat-conductive material. The encapsulation member 24 may be configured to fix the intermediate patch 23, the power-pin assembly 21 and the data pins 22 of the connection body 2, thereby ensuring the reliability of the connection between the connection line of the power adapter and the power interface 100. The encapsulation member 24 may include a first encapsulation portion 241 and a second encapsulation portion 242 connected to the first encapsulation portion 241. The first encapsulation portion 241 and the second encapsulation portion 242 may match with and cooperate with each other. More specifically, the second encapsulation portion 242 may define a plurality of receiving grooves 2421, and a plurality of embedding protrusions 2411 may be arranged on the first encapsulation portion 241. The plurality of receiving grooves 2421 may be in one-to-one correspondence with the plurality of embedding protrusions 2411, and cooperate with the plurality of embedding protrusions 2411. In this way, the reliability of the connection between the first encapsulation portion 241 and the second encapsulation portion 242 may be improved.

Figure 3:
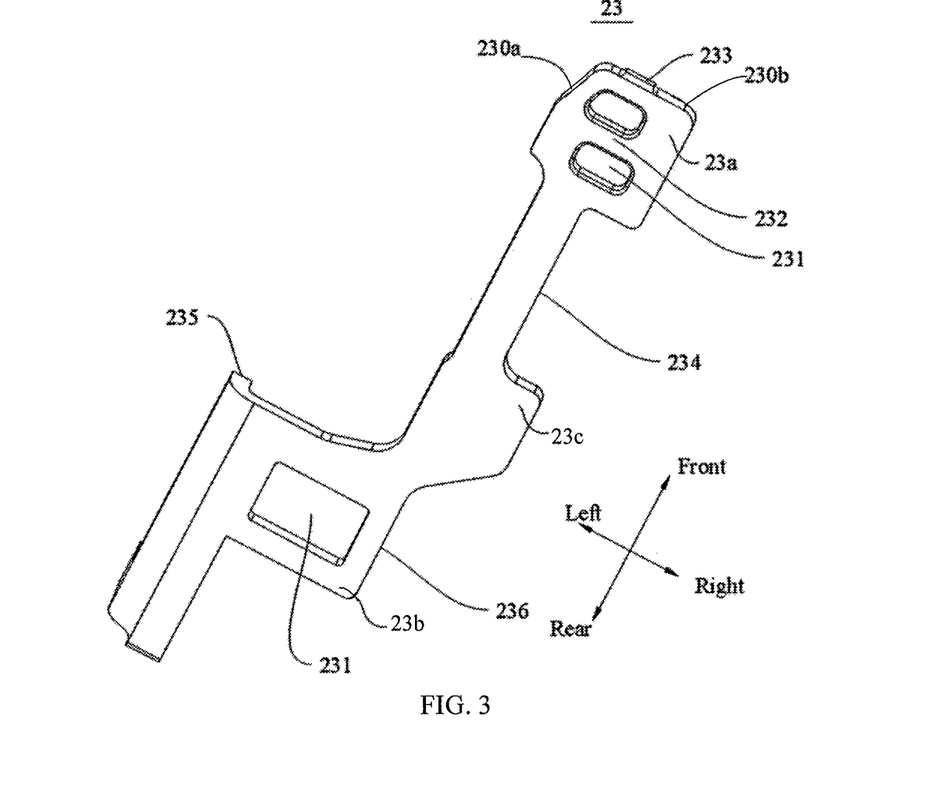
FIG. 3 is a structural view of an intermediate patch in the power interface according to some embodiments of the present disclosure.
Figure 4:
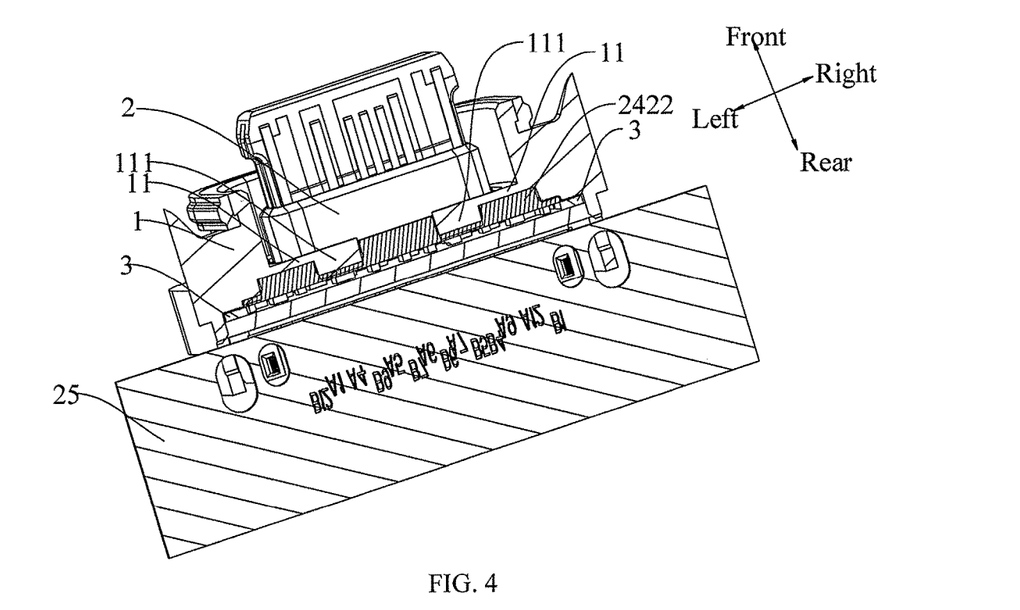
FIG. 4 is a cutaway view of the power interface according to some embodiments of the present disclosure.

As shown in FIG. 3, the head end 23a may define a through hole 231, and a reinforcing rib 232 may be arranged in the through hole 231. In this way, it is possible to not only save the material of the intermediate patch 23, but also improve the structural strength of the intermediate patch 23 by arranging the reinforcing rib 232 in the through hole 231.

In some embodiments of the present disclosure, as shown in FIG. 3, the reinforcing rib 232 may extend in the left-right direction. In this way, the structural strength of the intermediate patch 23 may be enhanced. Of course, the present disclosure may not be limited thereto. For example, the reinforcing rib 232 may extend in the front-rear direction, or an extending direction of the reinforcing rib 232 may be at an angle to the left-right direction, as long as the structural strength of the intermediate patch 23 may be enhanced.

In some embodiments of the present disclosure, as shown in FIG. 3, a reinforcing protrusion 233 that protrudes away from the connection body 2 may be arranged at the head end 23a. More specifically, the reinforcing protrusion 233 may protrude from an outer face of the head end 23a in a direction away from a center of the power interface. The reinforcing protrusion 233 may increase area of the contact surface between the intermediate patch 23 and the encapsulation member 24, enhance the adhesion between the intermediate patch 23 and the encapsulation member 24, and make the connection between the intermediate patch 23 and the encapsulation member 24 more stable. In this way, the intermediate patch 23 and the connection body 2 may be better fixed together by the encapsulation member 24.

Alternatively, as shown in FIG. 3, herein, the outer face may include a side wall face 230a and a front end face 230b. Therefore, the reinforcing protrusion 233 may be located on at least one of a side wall face 230a and a front end face 230b of the head end 23a. For example, in the example shown in FIG. 3, the front end face 230b of the head end 23a may be provided with the reinforcing protrusion 233, and the left-side wall face 230a in a left side of the head end 23a may be also provided with the reinforcing protrusion 233. In this way, it is possible to increase the contact surface between the intermediate patch 23 and the encapsulation member 24 to enhance the adhesion between the intermediate patch 23 and the encapsulation member 24 and make the connection between the intermediate patch 23 and the encapsulation member 24 more stable. In this way, the intermediate patch 23 and the connection body 2 may be better fixed together by the encapsulation member 24.

As shown in FIG. 3, in order to increase the flexibility of the intermediate patch 23, a notch 234 may be defined in the middle of the intermediate patch 23. In this way, when the intermediate patch 23 is shifted upwardly or downwardly, the intermediate patch 23 may quickly return back to the original position due to the notch 234, which facilitates the connection between the connection line of the power adapter and the power interface 100 next time.

In some embodiments of the present disclosure, as shown in FIG. 3, a crimping 235 may be arranged at the tail end 23b, and the crimping 235 may be bent in a direction towards one of the pair of power pins 211. Therefore, one of the pair of power pins 211 may be configured to be wrapped by the crimping 235. On one hand, the crimping 235 may increase the contact area between the intermediate patch 23 and the encapsulation member 24 to enhance the adhesion between the intermediate patch 23 and the encapsulation member 24, and make the connection between the intermediate patch 23 and the encapsulation member 24 more stable, thereby better fixing the intermediate patch 23 and the connection body 2 together by the encapsulation member 24. On the other hand, the crimping 235 may provide a protection to the power-pin assembly 21.

In addition, as shown in FIG. 3, the tail end 23b may have a widened portion 236, and the widened portion 236 may define a through hole 231. In this way, it is possible to further save the material of the intermediate patch 23. Of course, in order to ensure the structural strength of the intermediate patch 23, a reinforcing rib 232 may also be arranged in the through hole 231.

Furthermore, as shown in FIG. 1, the power interface 100 according to an embodiment of the present disclosure may further include a sealing member 4. The sealing member 4 may be made of soft material such as rubber or similar elastic materials, and have an annular configuration. The housing 1 may include a top portion 13 opposite to the connecting end 12.

The sealing member 4 may be disposed around the top portion 13 by means of dispensing, injection or the like. When the power interface 100 is mounted in the mobile terminal, the sealing member 4 could prevent liquid from entering the mobile terminal via a gap between the housing 1 and an inner face of the mobile terminal.

Referring to FIGS. 1-11, the power interface 100 according to embodiments of the present disclosure is described in details. It is noted that, the following description only is exemplary, and is not limitation to the present disclosure.

For convenience to describe, an example where the power interface 100 is implemented as a Type-C interface is described. The Type-C interface may also be called an USB (Universal Serial Bus) Type-C interface. The Type-C interface belongs to a type of an interface, and is a new data, video, audio and power transmission interface specification developed and customized by the USB standardization organization to solve the drawbacks present for a long time that the physical interface specifications of the USB interface are uniform, and that the power can only be transmitted in one direction.

The Type-C interface may have the following features: all devices supporting the Type-C interface may declare its willing to occupy a VBUS (that is, a positive connection wire of a traditional USB) to another device through a CC (Configuration Channel) pin in the interface specification. The device having a stronger willing may eventually output voltages and currents to the VBUS, while the other device may accept the power supplied from the VBUS bus, or the other device may still refuse to accept the power; however, it does not affect the transmission function. In order to use the definition of the bus more conveniently, a Type-C interface chip (such as LDR6013) may generally classify devices into four types: DFP (Downstream-facing Port), Strong DRP (Dual Role Power), DRP, and UFP (Upstream-facing Port). The willingness of these four types to occupy the VBUS may gradually decrease.

The DFP may correspond to an adapter, and may continuously output voltages to the VBUS. The Strong DRP may correspond to a mobile power, and may give up outputting voltages to the VBUS only when the strong DRP encounters the adapter. The DRP may correspond to a mobile phone. Normally, the DRP may expect other devices to supply power to itself. However, when encountering a device that may have a weaker willingness, the DRP may also output the voltages and currents to the device. The UFP will not output electrical power externally. Generally, the UFP is a weak battery device, or a device without any batteries, such as a Bluetooth headset. The USB Type-C interface may support the insertions both from a positive side and a negative side. Since there are four groups of power sources and grounds on both sides (the positive side and the negative side), the power supported by USB Type-C interface may be greatly improved.

The power interface 100 in this embodiment may be applied to a power adapter with the fast charging function, or a normal power adapter. The fast charging herein may refer to a charging state in which a charging current is greater than or equal to 2.5 A. The normal charging herein may refer to a charging state in which the charging current is less than 2.5 A. That is, when the power interface 100 is charged by the power adapter with the fast charging function, the charging current is greater than or equal to 2.5 A, or the rated output power is no less than 15 W. When the power interface 100 is charged by the normal power adapter, the charging current is less than 2.5 A, or the rated output power is less than 15 W.

More specifically, as shown in FIGS. 1-8, the power interface 100 may include a housing 1, a connection body 2, an intermediate patch 23, and an encapsulation member 24. The connection body 2 may be arranged in the housing 1, configured to be connected to the circuit board 25, and may include four power-pin assemblies 21. Each power-pin assembly 21 may include two power pins 21 spaced apart from each other in the up-down direction. The intermediate patch 23 may be sandwiched between the two power pins 211, such that it is possible to avoid poor contact between the connecting line and the power interface 100 caused by the movement of the two power pins 211 which are spaced apart from each other in the up-down direction towards each other. The intermediate patch 23 and the connection body 2 may be wrapped by the encapsulation member 24.

In this case, the encapsulation member 24 may be made of electrical insulating and heat-conductive material. The encapsulation member 24 may be configured to fix the intermediate patch 23, the power-pin assemblies 21 and the data pins 22 of the connection body 2, thereby ensuring the reliability of the connection between the connection line of the power adapter and the power interface 100. As shown in FIGS. 1, 5 and 6, the encapsulation member 24 may include a first encapsulation portion 241 and a second encapsulation portion 242 connected to first encapsulation portion 241. The second encapsulation portion 242 may define a plurality of receiving grooves 2421, and the first encapsulation portion 241 may include a plurality of embedding protrusions 2411. The plurality of receiving grooves 2421 may be in one-to-one correspondence with the plurality of embedding protrusions 2411, and cooperate with the plurality of embedding protrusions 2411. In this way, the reliability of the connection between the first encapsulation portion 241 and the second encapsulation portion 242 may be improved.

As shown in FIG. 3, the intermediate patch 23 may have a head end 23a close to a front end of the power-pin assembly 21, a tail end 23b close to a rear end of the power-pin assembly 21, and a connection portion 23c connected between the head end 23a and the tail end 23b. More specifically, the tail end 23b may be the one connected to the circuit board 25, and the head end 23a may be the one away from the circuit board 25 and opposite to the tail end 2. The head end 23a may define a through hole 231, and a reinforcing rib 232 may be arranged in the through hole 231. The reinforcing rib 232 may extend in the left-right direction. In this way, the material of the intermediate patch 23 may be saved, and the structural strength of the intermediate patch 23 may be enhanced. The head end 23a and the side wall face 230a in the left side of the head end 23a may have a reinforcing protrusion 233 that protrudes away from the connection body 2. The reinforcing protrusion 233 may increase the area of the contact surface between the intermediate patch 23 and the encapsulation member 24, enhance the adhesion between the intermediate patch 23 and the encapsulation member 24, and make the connection between the intermediate patch 23 and the encapsulation member 24 more stable. In this way, the intermediate patch 23 and the connection body 2 may be better fixed together by the encapsulation member 24.

As shown in FIG. 3, a notch 234 may be defined in the middle of the intermediate patch 23. In this way, when the intermediate patch 23 is shifted upwardly or downwardly, the intermediate patch 23 may quickly return back to the original position. A crimping 235 may be arranged at the tail end 23b, the crimping 235 may be bent in a direction towards one of the pair of power pins 211. Therefore, one of the pair of power pins 211 may be configured to be wrapped by the crimping 235. The crimping 235 may increase the contact surface between the intermediate patch 23 and the encapsulation member 24, and provide a protection to the power-pin assembly 21. The tail end 23b may have a widened portion 236, and the widened portion 236 may define a through hole 231, which further saves the material of the intermediate patch 23.

In addition, as shown in FIG. 1, FIG. 5 and FIG. 6, the tail end 23b may be spaced apart from the housing 1 and connected to the connection body 2. In this way, it is possible to avoid producing interference with the antenna signals, and thus the quality and the speed of signal transmission may be ensured. A plurality of first pads 251 and a plurality of second pads 252 may be arranged on the circuit board 25. Each of the plurality of first pads 251 and each of the plurality of second pads 252 may be spaced apart from each other may be arranged on the circuit board 25. The housing 1 may be welded on the first pad 251, and the tail end 23b may be welded on the second pad 252. In this way, the housing 1 and the intermediate patch 23 may be connected to the circuit board 25, thereby firmly fixing the connection body 2 to the circuit board 25 and preventing the power-pin assembly 21 of the connection body 2 from separating from the circuit board 25, and thus the reliability of the operation of the power interface 100 may be ensured.

As shown in FIG. 2, at least one power pin 211 may include an expanded portion 2111. The expanded portion 2111 may have a cross-sectional area larger than that of a data pin 22 of the connection body 2. In this way, the current load of the power pins 211 may be increased, and the transmission speed of the current may be improved. A recess 2112 may be defined in the expanded portion 2111 at a position that is close to the front end of the power pin 211. When the power interface 100 performs the fast charging function, the power pin 211 with the expanded portion 2111 may be used to carry a large charging current. When the power interface 100 performs the normal charging function, the recess 2112 on the expanded portion 2111 may prevent the power pin 211 from getting into contact with a corresponding pin of a power adapter.

In this case, as shown in FIG. 11, a thickness of the power pin 211 may be defined as D, and the cross-sectional area of the expanded portion 2111 may be defined as S. It has been experimentally verified that, when D=0.25 mm and S=0.13125 mm$^2$, the current load of the power pins 211 is at least 12 A, thereby improving the charging efficiency. Furthermore, as shown in FIG. 11, when W=0.25 mm, the current load of the power pins 211 is at least 14 A, thereby improving the charging efficiency.

Furthermore, as shown in FIGS. 4-8, a first stopping plate 11 may be arranged in the housing 1, and an engaging flange 2422 may be arranged on the second encapsulation portion 242. The power interface 100 may further include a second stopping plate 3. The second stopping plate 3 may be arranged in the housing 1, connected to the housing 1, and spaced apart from the first stopping plate 11. The engaging flange 2422 may be sandwiched between the first stopping plate 11 and the second stopping plate 3. In this way, the second encapsulation portion 242 may be fixed in the housing 1 by the first stopping plate 11 and the second stopping plate 3, thereby fixing the connection body 2 in the housing 1, and preventing the connection body 2 from moving in the up-down direction of the housing 1.

In this case, the first stopping plate 11 and the second stopping plate 3 may be made of metal, and the second stopping plate 3 may be made of stainless steel. The second stopping plate 3 may be connected to the housing 1 by means of spot welding. The housing 1 and the second stopping plate 3 made of metal may have a great structural strength. In this way, it is possible to enhance the structural strength of the power interface 100. In addition, since the inner space of the housing 1 is limited, when the second stopping plate 3 is welded on the housing 1, it is possible to simplify the processing and assembling processes, shorten manufacturing cycles, and reduce the manufacturing cost. A gap 31 may be defined between the second stopping plate 3 and the housing 1, and an adhesive layer 311 may be arranged in the gap 31. On one hand, the adhesive layer 311 may further bond the second stopping plate 3 with the housing 1 to improve the reliability of the connection between the second stopping plate 3 and the housing 1. On the other hand, the adhesive layer 311 may have a waterproof function; that is, the adhesive layer 311 may prevent liquid from entering the power interface 100 via an open end of the power interface 100 and damaging of the circuit board 25 inside the power interface 100, and the like, thereby ensuring the reliability of the power interface 100. In this embodiment, a pair of second stopping plates 3 may be provided. The pair of second stopping plates 3 may extend in the circumferential direction of the housing 1. The pair of second stopping plates 3 may form an annular stopping plate. In this way, the reliability of the connection between the second stopping plate 3 and the housing 1 may be enhanced, and the structure of the second stopping plate 3 may be simplified.

The first stopping plate 11 may also extend in the circumferential direction of the connection body 2. In this way, it is possible to enhance the fixing of the connection body 2 by the first stopping plate 11. A stopping protrusion 111 may be arranged on a sidewall face of the first stopping plate 11 that faces towards the second stopping plate 3, and the stopping protrusion 111 may be engaged in engaging groove 2423 defined in the engaging flanges 2422. In this way, it is possible to prevent the connection body 2 from shaking in the housing 1 by the cooperation between the engaging flange 2422 and the stopping protrusion 111, and thus it is possible to ensure the reliability of the operation of the power interface 100.

A method for manufacturing the power interface 100 according to an embodiment of the present disclosure will now be described with reference to FIGS. 1-11. Herein, the power interface 100 may be the power interface 100 described above.

Figure 12:
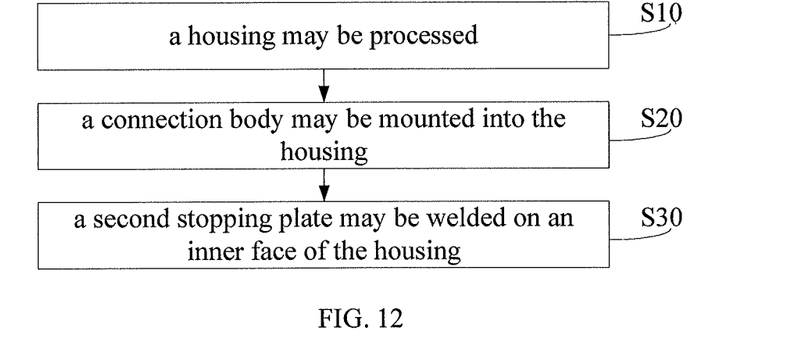
FIG. 12 is a flow diagram of a method for manufacturing the power interface according to an embodiment of the present disclosure.

As shown in FIG. 12, the method for manufacturing the power interface 100 according to an embodiment of the present disclosure may include operations at the following blocks:

At block S10: a housing 1 may be processed. A first stopping plate 11 may be arranged in the housing 1.

At block S20: a connection body 2 may be mounted into the housing 1. An engaging flange 2422 may be arranged on the connection body 2.

At block S30: a second stopping plate 3 may be welded on an inner face 1111 of the housing 1. The second stopping plate 3 may be attached on the inner face 1111 of the housing 1 along a circumference direction of the housing 1 and spaced apart from the first stopping plate 11, such that an engaging flange 2422 may be sandwiched between the first stopping plate 11 and the second stopping plate 3.

According to the method for manufacturing the power interface 100 of the embodiment of the present disclosure, the connection body 2 may be fixed in the housing 1, thereby ensuring the reliability of the operation of the power interface 100.

The housing 1 at the block S10 may be an injection molded part, and the first stopping plate 11 may be injected on the inner face 1111 of the housing 1, which may facilitate the processing of the housing 1 and the first stopping plate 11. At the block S30, the second stopping plate 3 may be connected to the housing 1 by means of spot welding. The spot welding may be a quick and economical connection method in which the weldments may be welded to each other on the contact surface at the joint between the weldments by individual welding spots.

Furthermore, a gap 31 may be defined between the second stopping plate 3 and the housing 1. The method for manufacturing the power interface 100 may further include: arranging an adhesive layer 311 in the gap 31, such that the second stopping plate 3 and the housing 1 may be closely bonded with each other, and liquid may be prevent from entering the power interface 100.

A mobile terminal according to an embodiment of the present disclosure may include the power interface 100 as described above. The mobile terminal may realize the transmission of electrical signals and data signals via the power interface 100. For example, the mobile terminal may be electrically connected to the power adapter through the power interface 100 to implement a charging or data transmission function.

In the mobile terminal according to an embodiment of the present disclosure, by arranging the first stopping plate 11 in the housing 1 and arranging the engaging flange 2422 on the connection body 2, and fixing the engaging flange 2422 in the housing 1 by the first stopping plate 11 and the second stopping plate 3, the connection body 2 can be fixed in the housing 1 to prevent the connection body 2 from moving in the up-down direction of the housing 1, and the connection body 2 can be prevented from being separated from the housing 1. Therefore, when a connection line of a power adapter is inserted into the power interface 100, the reliability of the connection between the connection line and the power interface 100 may be improved.

A power adapter according to an embodiment of the present disclosure may include the power interface 100 as described above. The power adapter may realize the transmission of electrical signals and data signals via the power interface 100.

In the power adapter according to an embodiment of present disclosure, by arranging the first stopping plate 11 in the housing 1 and arranging the engaging flange 2422 on the connection body 2, and fixing the engaging flange 2422 in the housing 1 by the first stopping plate 11 and the second stopping plate 3, the connection body 2 can be fixed in the housing 1 to prevent the connection body 2 from moving in the up-down direction of the housing 1, and the connection body 2 can be prevented from being separated from the housing 1. Therefore, when a connection line of a power adapter is inserted into the power interface 100, the reliability of the connection between the connection line and the power interface 100 may be improved.

A mobile terminal according to an embodiment of the present disclosure may include a circuit board 25 and a power interface 100. The power interface 100 may be configured to be connected to a power adapter. The power interface 100 may include a housing 1, a stopping plate 11, an annular baffle 3, a connection body 2 and a plurality of positioning protrusions 2422. The housing 1 may be connected to the circuit board 25. The stopping plate 11 may be arranged in the housing 1 and connected to the housing 1 and can define a first through hole 112. The annular baffle 3 may be arranged in the housing 1 and connected to the housing 1, and can define a second through hole 32, and may be spaced apart from the stopping plate 11. The connection body 2 can be arranged in the housing 1 and can pass through the first through hole 112 and the second through hole 32 and may be connected to the circuit board 25. The plurality of positioning protrusions 2422 may be arranged on a peripheral face of the connection body 2 and sandwiched between the stopping plate 11 and the annular baffle 3.

In some embodiments, a plurality of stopping protrusions 111 may be arranged on a sidewall face of the stopping plate 11 facing towards the annular baffle 3. Two adjacent positioning protrusions 2422 can define an engaging groove 2423. Each of the stopping protrusions 111 can be engaged in a corresponding engaging groove 2423.

In some embodiments, the connection body 2 may include at least one power-pin assembly 21. And each power-pin assembly 21 may include a pair of power pins 211 spaced apart from each other.

In some embodiments, at least one of the pair of power pins 211 may include an expanded portion 2111. The expanded portion 2111 can have a cross-sectional area larger than that of a data pin 22 of the connection body 2 to increase a current load of the at least one of the pair of power pins 211.

In some embodiments, the power interface 100 may include an intermediate patch 23 sandwiched between the pair of power pins 211.

Reference throughout this specification, the reference terms "an embodiment", "some embodiments", "an example", "a specific example", or "some examples", and the like means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, one skilled in the art may combine the different embodiments or examples described in this specification and features of different embodiments or examples without conflicting with each other.

Although explanatory embodiments have been shown and described, it would be appreciated by one skilled in the art that the above embodiments previously described are illustrative, and cannot be construed to limit the present disclosure. Changes, alternatives, and modifications can be made in the embodiments without departing from scope of the present disclosure.

What is claimed is:

1. A power interface, comprising:
   a housing, wherein a first stopping plate is arranged in the housing;
   a connection body, arranged in the housing, wherein an engaging flange is arranged on the connection body, the connection body is configured to be connected to a circuit board and comprises at least a pair of power pins, each pair of power pins comprises two sub-pins spaced apart from each other in an up-down direction, an intermediate patch is sandwiched between two sub-pins of a corresponding pair of power pins, at least one sub-pin comprises an expanded portion, a recess is defined in the expanded portion at a position that is close to the front end of the sub-pin; and
   a plurality of second stopping plates, located in the housing and connected to the housing and shaping an annular configuration, wherein the plurality of second stopping plates are spaced apart from the first stopping plate, the engaging flange is sandwiched between the first stopping plate and the plurality of second stopping plates, a stopping protrusion is arranged on a sidewall face of the first stopping plate facing towards the plurality of second stopping plates, and the stopping protrusion is engaged with the engaging flange.

2. The power interface of claim 1, wherein the housing and the plurality of second stopping plates are made of metal, and the plurality of second stopping plates are welded to the housing;
   wherein the plurality of second stopping plates are made of stainless steel.

3. The power interface of claim 1, wherein a gap is defined between the plurality of second stopping plates and the housing, and an adhesive layer is arranged in the gap, wherein the adhesive layer is a dispensing layer.

4. The power interface of claim 1, wherein the plurality of second stopping plates extend along a peripheral circumferential direction of the connection body.

5. The power interface of claim 1, wherein the first stopping plate extends along a peripheral circumferential direction of the connection body.

6. The power interface of claim 1, wherein the intermediate patch is directly contacted with each sub-pin of the corresponding pair of power pins.

7. The power interface of claim 1, wherein the intermediate patch comprises a head end close to a front end of the pair of power pins, a tail end close to a rear end of the pair of power pins, a connection portion connected between the head end and the tail end, and a crimping arranged at the tail end and bent in a direction towards one of the pair of power pins to wrap the one of the pair of power pins.

8. A mobile terminal comprising a power interface, wherein the power interface comprises:
   a housing, wherein a first stopping plate is arranged in the housing;
   a connection body, arranged in the housing, wherein an engaging flange is arranged on the connection body, the connection body is configured to be connected to a circuit board and comprises at least a pair of power pins, each pair of power pins comprises two sub-pins spaced apart from each other in an up-down direction, an intermediate patch is sandwiched between two sub-pins of a corresponding pair of power pins, at least one sub-pin comprises an expanded portion, a recess is defined in the expanded portion at a position that is close to the front end of the sub-pin; and
   a plurality of second stopping plates, located in the housing and connected to the housing and shaping an annular configuration, wherein the plurality of second stopping plates are spaced apart from the first stopping plate, the engaging flange is sandwiched between the first stopping plate and the plurality of second stopping plates, a stopping protrusion is arranged on a sidewall face of the first stopping plate facing towards the plurality of second stopping plates, and the stopping protrusion is engaged with the engaging flange.

9. The mobile terminal of claim 8, wherein the housing and the plurality of second stopping plates are made of metal, and the plurality of second stopping plates are welded to the housing;
   wherein the plurality of second stopping plates are made of stainless steel.

10. The mobile terminal of claim 8, wherein a gap is defined between the plurality of second stopping plates and the housing, and an adhesive layer is arranged in the gap, wherein the adhesive layer is a dispensing layer.

11. The mobile terminal of claim 8, wherein the plurality of second stopping plates extend along a peripheral circumferential direction of the connection body.

12. The mobile terminal of claim 8, wherein the first stopping plate extends along a peripheral circumferential direction of the connection body.

13. The mobile terminal of claim 8, wherein the intermediate patch is directly contacted with each sub-pin of the corresponding pair of power pins.

14. The mobile terminal of claim 8, wherein the intermediate patch comprises a head end close to a front end of the pair of power pins, a tail end close to a rear end of the pair of power pins, a connection portion connected between the head end and the tail end, and a crimping arranged at the tail end and bent in a direction towards one of the pair of power pins to wrap the one of the pair of power pins.

15. A power adapter comprising a power interface, wherein the power interface comprises:
   a housing, wherein a first stopping plate is arranged in the housing;
   a connection body, arranged in the housing, wherein an engaging flange is arranged on the connection body, the connection body is configured to be connected to a circuit board and comprises at least a pair of power pins, each pair of power pins comprises two sub-pins spaced apart from each other in an up-down direction, an intermediate patch is sandwiched between two sub-pins of a corresponding pair of power pins, at least one sub-pin comprises an expanded portion, a recess is defined in the expanded portion at a position that is close to the front end of the sub-pin; and a plurality of second stopping plates, located in the housing and connected to the housing and shaping an annular configuration, wherein the plurality of second stopping plates are spaced apart from the first stopping plate, the engaging flange is sandwiched between the first stopping plate and the plurality of second stopping plates, a stopping protrusion is arranged on a sidewall face of the first stopping plate facing towards the plurality of second stopping plates, and the stopping protrusion is engaged with the engaging flange.

16. The power adapter of claim 15, wherein the housing and the plurality of second stopping plates are made of metal, and the plurality of second stopping plates are welded to the housing;

wherein the plurality of second stopping plates are made of stainless steel.

17. The power adapter of claim 15, wherein a gap is defined between the plurality of second stopping plates and the housing, and an adhesive layer is arranged in the gap, wherein the adhesive layer is a dispensing layer.

18. The power adapter of claim 15, wherein the plurality of second stopping plates extend along a peripheral circumferential direction of the connection body.

19. The power adapter of claim 15, wherein the intermediate patch is directly contacted with each sub-pin of the corresponding pair of power pins.

20. The power adapter of claim 15, wherein the intermediate patch comprises a head end close to a front end of the pair of power pins, a tail end close to a rear end of the pair of power pins, a connection portion connected between the head end and the tail end, and a crimping arranged at the tail end and bent in a direction towards one of the pair of power pins to wrap the one of the pair of power pins.

\* \* \* \* \*

UNITED STATES PATENT AND TRADEMARK OFFICE
CERTIFICATE OF CORRECTION

PATENT NO. : 10,811,793 B2
APPLICATION NO. : 16/442080
DATED : October 20, 2020
INVENTOR(S) : Guodong Gu et al.

It is certified that error appears in the above-identified patent and that said Letters Patent is hereby corrected as shown below:

On the Title Page

Item (63), should read:
Continuation of application no. 16/245,054, filed on January 10, 2019, which is a continuation-in-part of application no. PCT/CN2017/082260, filed on April 27, 2017.

Signed and Sealed this
Twenty-second Day of December, 2020

Andrei Iancu
*Director of the United States Patent and Trademark Office*